United States Patent
Vegh et al.

(10) Patent No.: US 8,828,744 B2
(45) Date of Patent: Sep. 9, 2014

(54) METHOD FOR ETCHING WITH CONTROLLED WIGGLING

(71) Applicant: Lam Research Corporation, Fremont, CA (US)

(72) Inventors: Joseph J. Vegh, Fremont, CA (US); Yungho Noh, Hwaseong (KR)

(73) Assignee: Lam Research Corporation, Fremont, CA (US)

( * ) Notice: Subject to any disclaimer, the term of this patent is extended or adjusted under 35 U.S.C. 154(b) by 124 days.

(21) Appl. No.: 13/625,632

(22) Filed: Sep. 24, 2012

(65) Prior Publication Data
US 2014/0087486 A1  Mar. 27, 2014

(51) Int. Cl.
*H01L 21/3065* (2006.01)

(52) U.S. Cl.
USPC ........ 438/4; 438/689; 438/706; 438/710; 438/725; 438/798; 257/E21.218

(58) Field of Classification Search
USPC ............................................. 438/4
See application file for complete search history.

(56) References Cited

U.S. PATENT DOCUMENTS

| | | | |
|---|---|---|---|
| 6,811,956 B1 | 11/2004 | Gabriel | |
| 7,053,003 B2 | 5/2006 | Kanarik et al. | |
| 2001/0037994 A1* | 11/2001 | Ezaki | 216/62 |
| 2006/0065624 A1* | 3/2006 | Mizumura et al. | 216/59 |
| 2006/0128163 A1* | 6/2006 | Chen et al. | 438/780 |
| 2006/0154184 A1* | 7/2006 | Mahorowala et al. | 430/323 |
| 2009/0017563 A1* | 1/2009 | Jiang et al. | 438/4 |
| 2010/0015809 A1 | 1/2010 | Adams et al. | |
| 2011/0097821 A1* | 4/2011 | Sirard et al. | 438/4 |
| 2012/0007221 A1 | 1/2012 | Huang et al. | |
| 2013/0005150 A1* | 1/2013 | Ogihara et al. | 438/694 |

* cited by examiner

*Primary Examiner* — Angel Roman
(74) *Attorney, Agent, or Firm* — Beyer Law Group LLP (57) ABSTRACT

A method for etching trenches in an etch layer disposed below a patterned organic mask is provided. The patterned organic mask is treated, comprising flowing a treatment gas comprising $H_2$ and $N_2$, forming a plasma from the treatment gas, making patterned organic mask more resistant to wiggling, and stopping the flow of the treatment gas. Trenches are etched in the etch layer through the patterned organic mask.

18 Claims, 9 Drawing Sheets

METHOD FOR ETCHING WITH CONTROLLED WIGGLING

BACKGROUND OF THE INVENTION

Field of the Invention

The invention relates to a method of forming semiconductor devices on a semiconductor wafer. More specifically, the invention relates to etching a dielectric layer in the formation of memory.

In forming semiconductor devices, some devices may be etched with trenches to form memory lines.

SUMMARY OF THE INVENTION

To achieve the foregoing and in accordance with the purpose of the present invention, a method for etching trenches in an etch layer disposed below a patterned organic mask is provided. The patterned organic mask is treated, comprising flowing a treatment gas comprising $H_2$ and $N_2$, forming a plasma from the treatment gas, making patterned organic mask more resistant to wiggling, and stopping the flow of the treatment gas. Trenches are etched in the etch layer through the patterned organic mask.

In another manifestation of the invention, a method for etching trenches in an etch layer disposed below a patterned organic mask is provided. Trenches are partially etched in the etch layer through the organic mask, comprising flowing a fluorine containing etch gas, forming a plasma from the etch gas, wherein the plasma from the etch gas causes wiggling of the patterned organic mask, and stopping the flow of the etch gas. The patterned organic mask is treated, comprising flowing a treatment gas comprising $H_2$ and $N_2$, wherein the treatment gas is halogen free, forming a plasma from the treatment gas, repairing wiggling of the patterned organic mask, making patterned organic mask more resistant to wiggling, and stopping the flow of the treatment gas. Trenches are etched in the etch layer through the patterned organic mask, comprising flowing a fluorine containing etch gas, forming a plasma from the etch gas. The flow of the etch gas is stopped.

In another manifestation of the invention, an apparatus for etching trenches in an etch layer, disposed below a patterned organic mask is provide. A plasma processing chamber is provided, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, at least one RF power source electrically connected to the at least one electrode, a gas inlet for providing gas into the plasma processing chamber enclosure, and a gas outlet for exhausting gas from the plasma processing chamber enclosure. A gas source is in fluid connection with the gas inlet. The gas source comprises a fluorine containing etch gas source and a treatment gas source, comprising an $H_2$ source and an $N_2$ source. A controller is controllably connected to the gas source and the at least one RF power source. The controller comprises at least one processor and computer readable media. The computer readable media comprises computer readable code for treating the organic mask, comprising computer readable code for flowing a treatment gas from the treatment gas source, comprising $H_2$ and $N_2$ from the $H_2$ source and $N_2$ source, respectively, computer readable code for forming a plasma from the treatment gas, making patterned organic mask more resistant to wiggling, and computer readable code for stopping the flow of the treatment gas, and computer readable code for etching trenches in the etch layer through the patterned organic mask.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
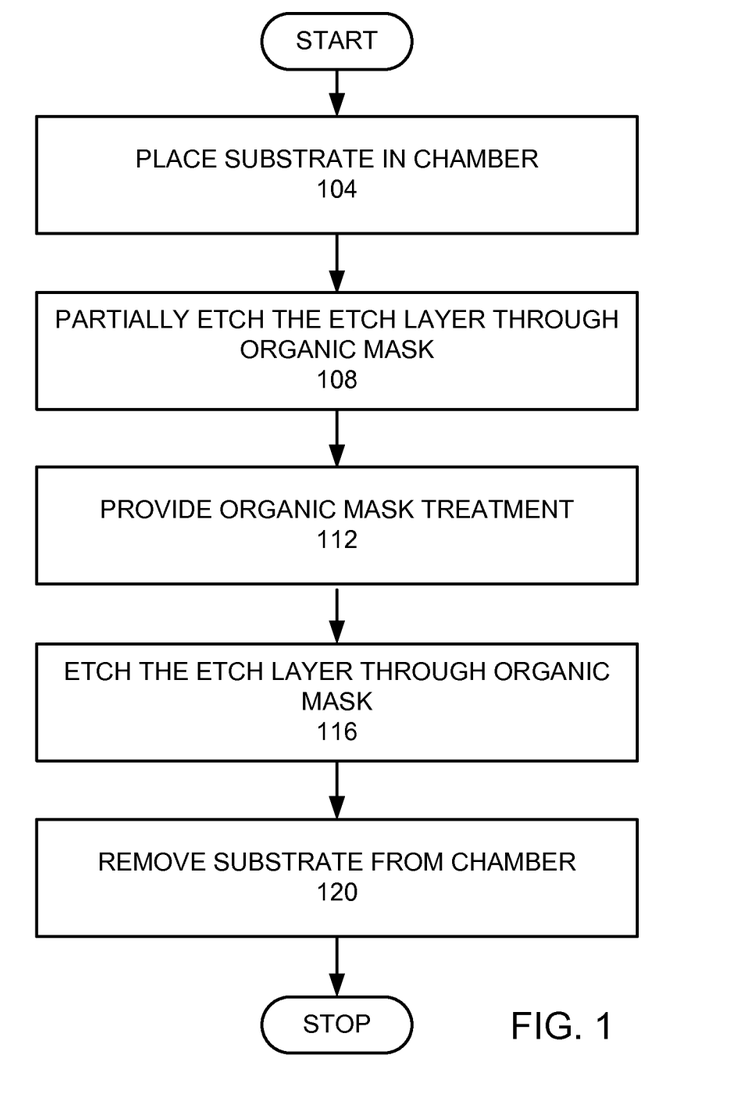
FIG. 1 is a high level flow chart of an embodiment of the invention.

FIG. 1 is a high level flow chart of an embodiment of the invention. In this embodiment, a substrate is placed in an etch chamber (step 104). Preferably, the substrate has an etch layer disposed below an organic mask, such as an amorphous carbon mask, with patterned trenches to form lines for memory. The etch layer is partially etched through the organic mask (step 108), using a halogen etch. Such a halogen etch causes the amorphous carbon mask to wiggle. An organic mask treatment is provided (step 112). The treatment using a plasma formed from hydrogen and nitrogen repairs the wiggling and hardens the organic mask to subsequent wiggling. The etch layer is etched through the organic mask (step 116), using a halogen etch. The substrate is removed from the chamber (step 120).

Example

Figure 2A:
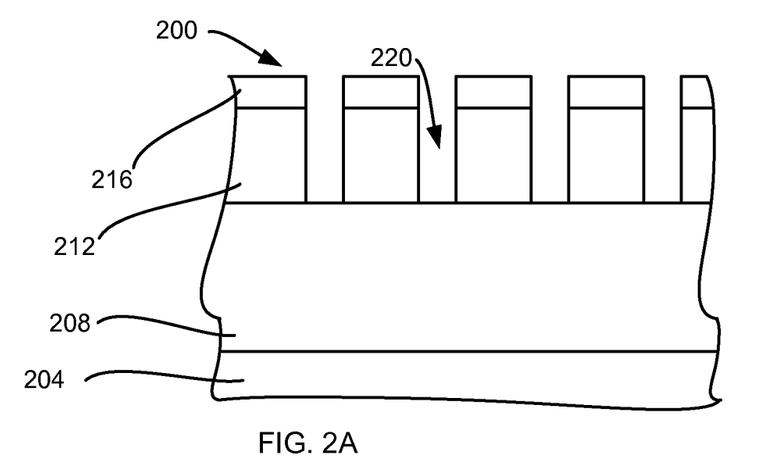
FIGS. 2A-D are schematic cross-sectional views of a stack processed according to an embodiment of the invention.

In a preferred embodiment of the invention, a substrate with an etch layer of silicon oxide disposed under an organic mask disposed under a cap layer is placed in an etch chamber (step 104). FIG. 2A is a schematic cross-sectional view of a stack 200 with a substrate 204 with an etch layer 208 disposed below an organic mask 212, disposed below a cap layer 216. In this example, one or more layers may be disposed between the substrate 204 and the etch layer 208, or the etch layer 208 and the organic mask 212, or the organic mask 212 and the cap layer 216. In this example, the organic mask 212 is amorphous carbon, the cap layer 216 is silicon oxynitride (SiON), and the etch layer 208 is a silicon oxide based dielectric. In this example, mask pattern trenches 220 have been formed in the organic mask 212 and cap layer 216. In some embodiments, the mask pattern trenches 220 are formed before the substrate is placed in the chamber. In other embodiments, the mask pattern trenches 220 are formed while the substrate is in the chamber. In some embodiments, a patterned photoresist mask is formed above the cap layer 216. The pattern of the patterned photoresist mask is transferred to the cap layer 216 and the organic mask 212. In another embodiment, a double pattern process is used to provide a higher density of trenches in the organic mask 212.

Figure 3A:
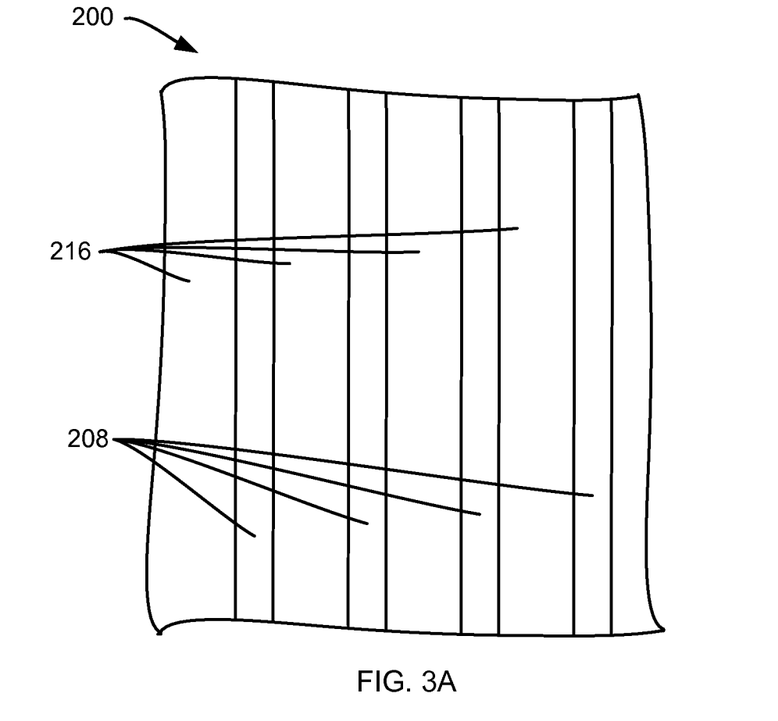
FIGS. 3A-D are schematic top views of a stack processed according to an embodiment of the invention.

FIG. 3A is a top view of the stack 200, shown in FIG. 2A. The cap layer 216 is shown at the top of lines of the organic mask 212, and the etch layer 208 is shown at the bottom of the mask pattern trenches 220. The lines are linear and straight.

Figure 4:
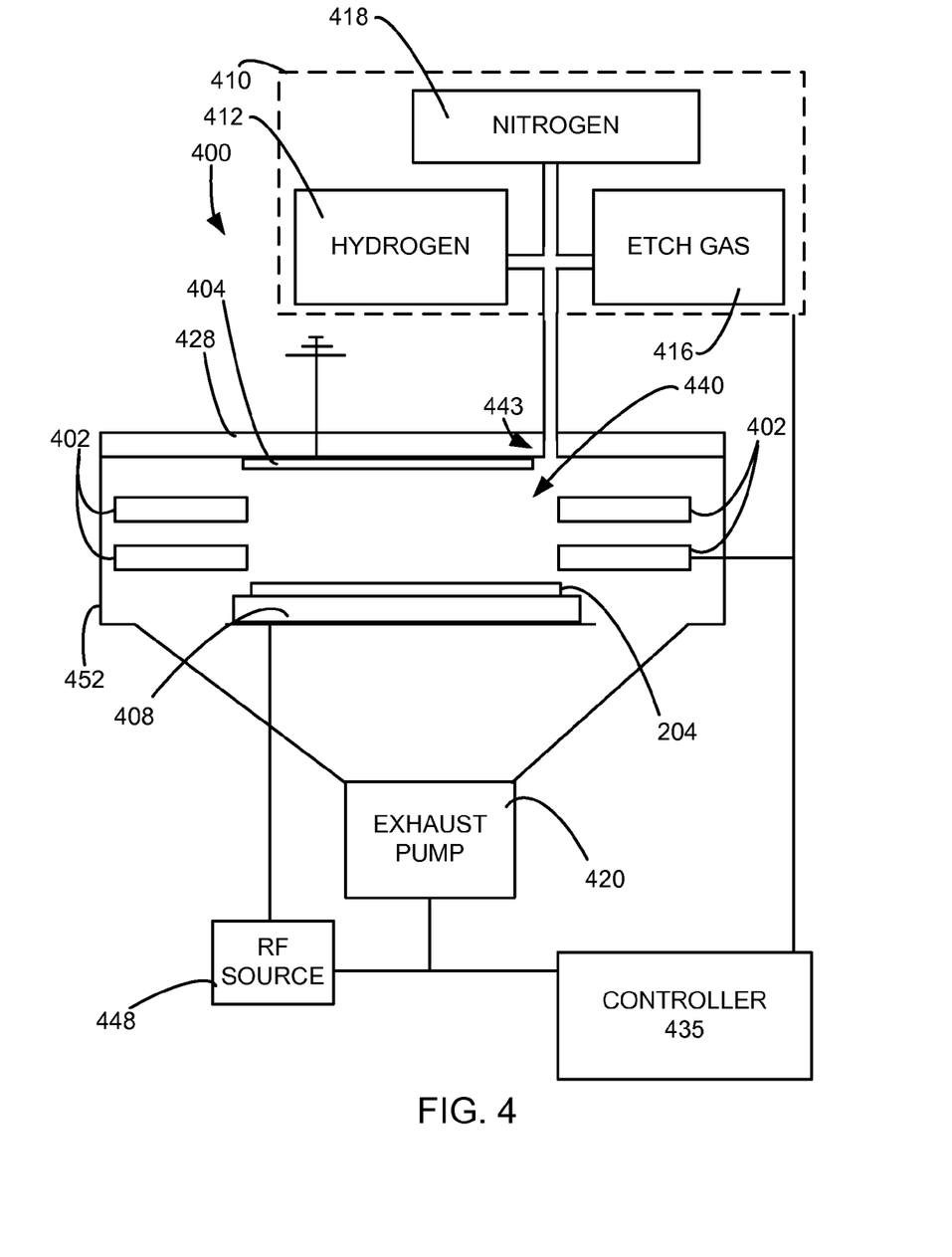
FIG. 4 is a schematic view of a plasma processing chamber that may be used in an embodiment of the invention.

FIG. 4 is a schematic view of a plasma processing chamber 400 that may be used for one or more of the following steps. The plasma processing chamber 400 comprises confinement rings 402, an upper electrode 404, a lower electrode 408, a gas source 410, and an exhaust pump 420. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume 440 through a gas inlet 443 by the gas source 410 and is exhausted from the confined plasma volume 440 through the confinement rings 402 and an exhaust port by the exhaust pump 420. Besides helping to exhaust the gas, the exhaust pump 420 helps to regulate pressure. In this embodiment, the gas source 410 comprises a hydrogen gas source 412, a etch gas source 416, and a nitrogen gas source 418. The gas source 410 may further comprise other gas sources. An RF source 448 is electrically connected to the lower electrode 408. Chamber walls 452 surround the confinement rings 402, the upper electrode 404, and the lower electrode 408. Different combinations of connecting RF power to the electrode are possible. In a preferred embodiment, the 27 MHz, 60 MHz and 2 MHz power sources make up the RF power source 448 connected to the lower electrode 408, and the upper electrode 404 is grounded. A controller 435 is controllably connected to the RF source 448, exhaust pump 420, and the gas source 410. The process chamber can be a CCP (capacitive coupled plasma) reactor or an ICP (inductive coupled plasma) reactor.

Figure 5:
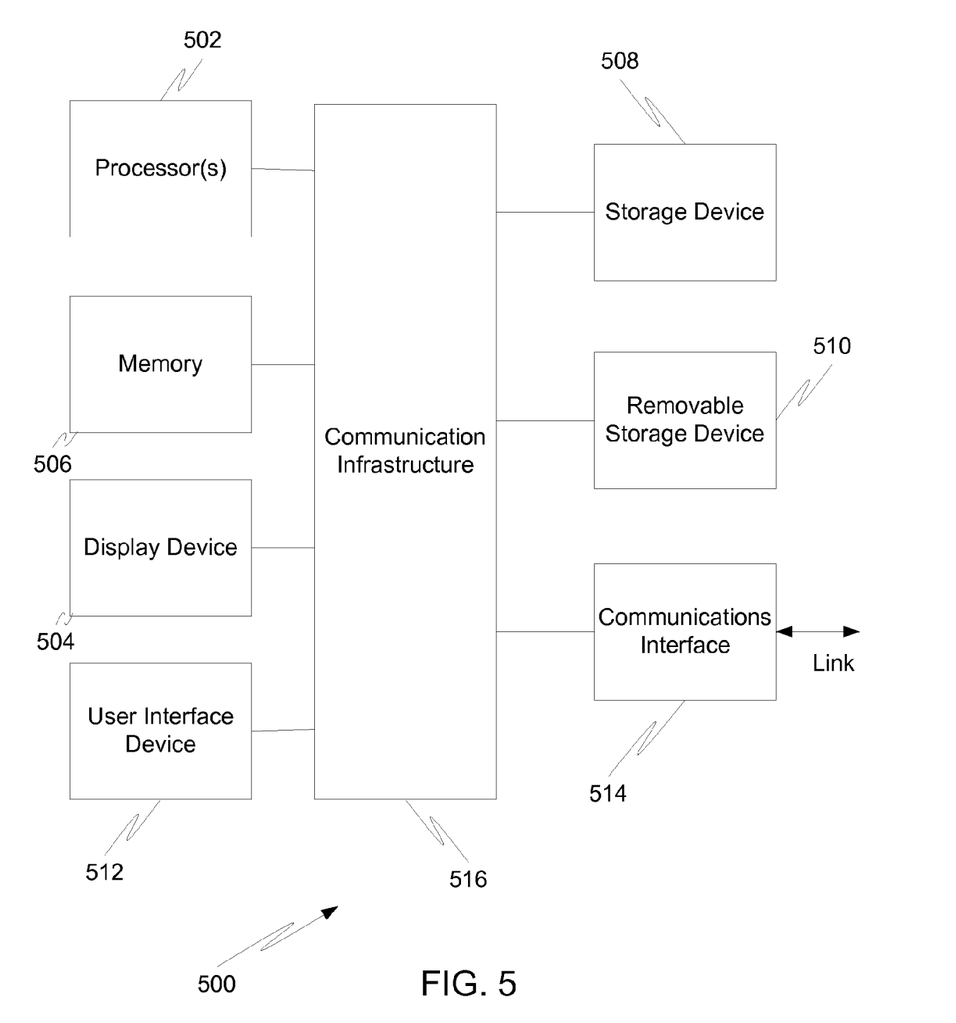
FIG. 5 is a schematic view of a computer system that may be used in practicing the invention.

FIG. 5 is a high level block diagram showing a computer system 500, which is suitable for implementing a controller 435 used in embodiments of the present invention. The computer system may have many physical forms ranging from an integrated circuit, a printed circuit board, and a small handheld device up to a huge super computer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communication interface 514 (e.g., wireless network interface). The communication interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 6:
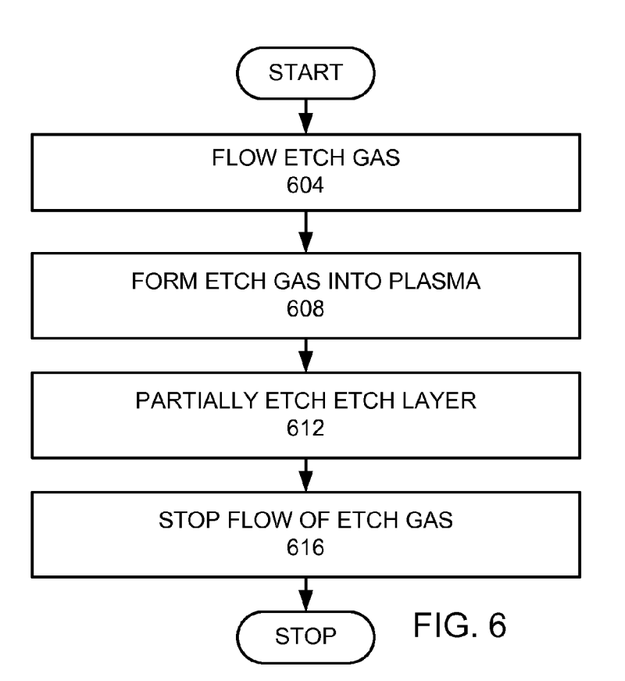
FIG. 6 is a more detailed flow chart of the step of partially etching the etch layer

After the substrate 204 has been placed into the plasma processing chamber 400, the etch layer 208 is partially etched (step 108). FIG. 6 is a more detailed flow chart of the step of partially etching the etch layer. An etch gas comprising a fluorine containing etchant is flowed from the etch gas source 416 into the plasma processing chamber 400 (step 604). The etch gas is formed into a plasma (step 608). Exposure of the etch layer 208 to the plasma from the etch gas causes part of the etch layer to be etched away (step 612), the cap layer 216 to be partially or completely etched away, and the organic mask to wiggle. After the partial etch is completed, the process is stopped, which in this example, is by stopping the flow of the etch gas (step 616).

An example of a recipe provides a pressure of 20 mTorr. An etch gas of 20-40 sccm of a mixture of one or more of $CHF_3$, $C_4F_8$, or $CH_2F_2$, and 10-20 sccm $O_2$, and 100-200 sccm Ar is flowed from the etch gas source 416 into the plasma processing chamber 400 (step 604). An RF signal at 475 watts is provided to the plasma processing chamber 400 to form the etch gas into a plasma (step 608). A temperature is maintained at 30° C. The process is maintained for 30 seconds to partially etch the etch layer (step 612), before the flow of the etch gas is stopped (step 616).

Figure 2B:
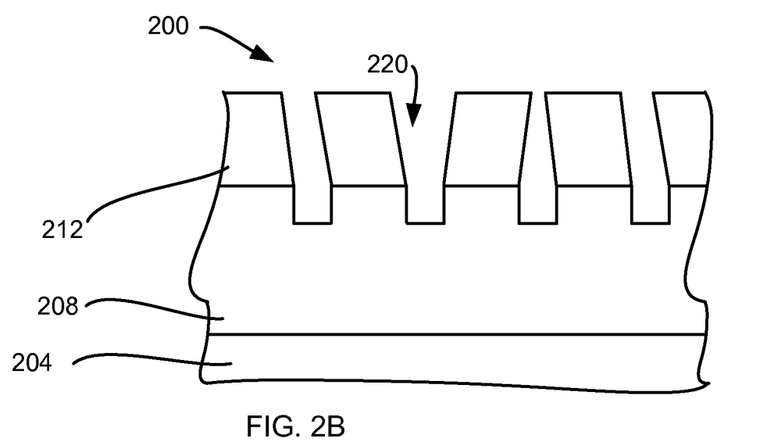
Figure 3B:
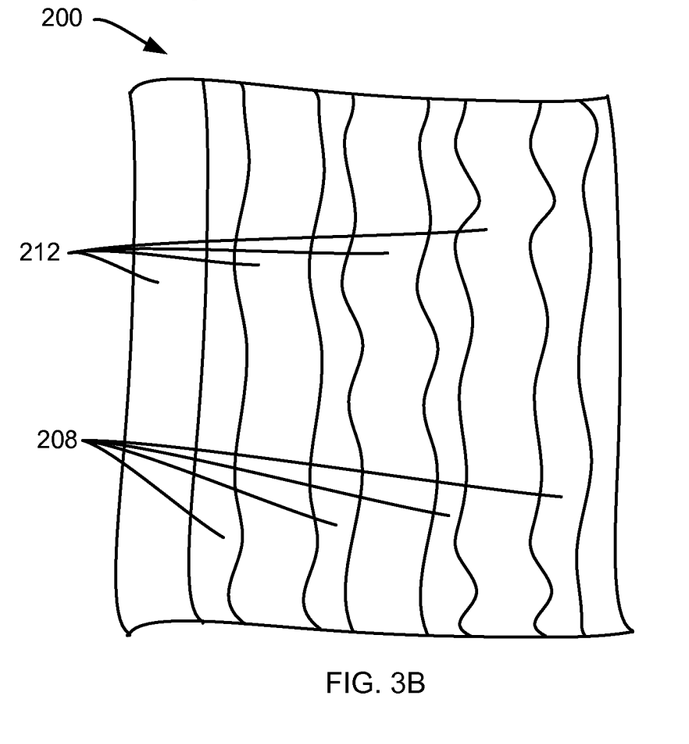

FIG. 2B is a cross-sectional view of the stack 200 after the cap is etch away and the etch layer is partially etched. FIG. 3B is a top view of the stack after the partial etch. The etch layer 208 has been partially etched. The organic mask 212 is wiggling instead of being straight. If the etching process continues the wiggling of the organic mask 212 will cause wiggling of the trench, causing wiggling of the lines. Experimental data measuring wiggling of the organic mask 212 from a partial etch found LER (Line edge roughness) of 4.2 nm 3σ.

Figure 7:
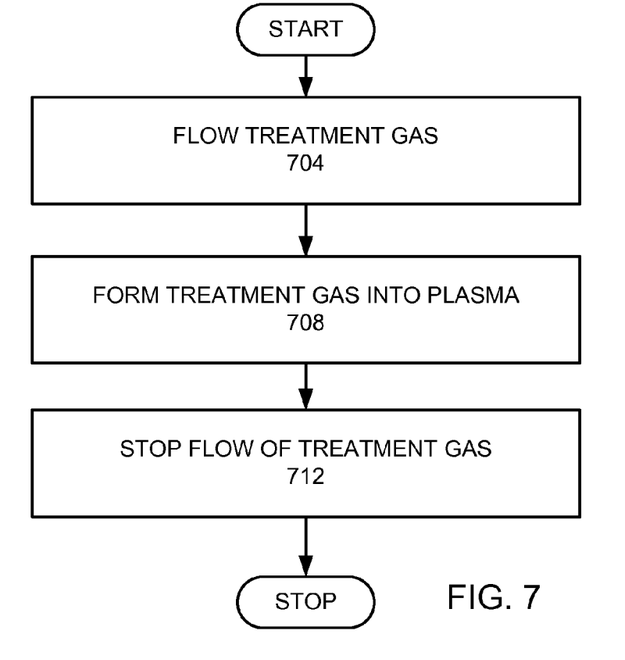
FIG. 7 is a more detailed flow chart of the step of treating the organic mask.

After the partial etch is stopped, an organic mask treatment is provided (step 112). FIG. 7 is a more detailed flow chart of the step of providing an organic mask treatment. A treatment gas comprising $H_2$ and $N_2$ is flowed from the hydrogen gas source 412 and the nitrogen gas source 418 into the plasma processing chamber 400 (step 704). The treatment gas is formed into a plasma (step 708). Exposure of the organic mask to the plasma from the treatment gas reduces the wiggle of the organic mask and makes the organic mask resistant to wiggling. The treatment process is stopped, which in this example is by stopping the flow of the $H_2$ and $N_2$ gas (step 712).

An example of a recipe provides a pressure of 60 mTorr. A treatment gas of 150 sccm $H_2$ and 280 sccm $N_2$ is flowed from the gas source 410 into the plasma processing chamber 400 (step 704). An RF signal at 400 watts is provided to the plasma processing chamber 400 to form the etch gas into a plasma (step 608). A temperature is maintained at 30° C. The process is maintained for 15 seconds to treat the partially etched surface, before the flow of the etch gas is stopped (step 616).

Figure 2C:
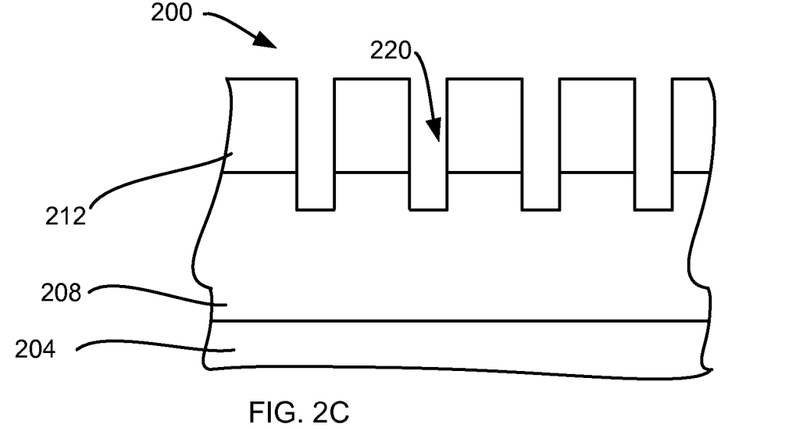
Figure 3C:
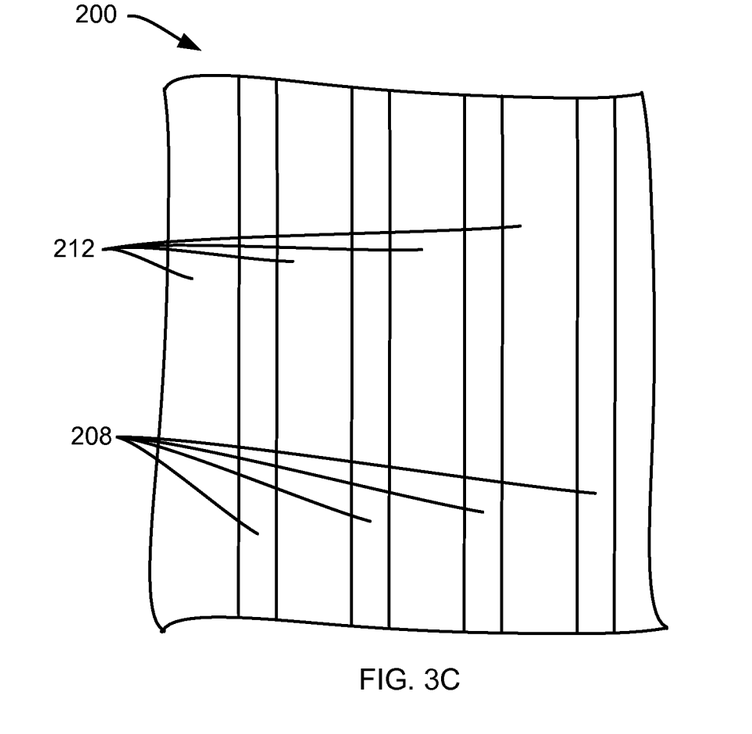

FIG. 2C is a cross-sectional view of the stack 200 after the organic mask treatment. FIG. 3C is a top view of the stack after the organic mask treatment. As schematically illustrated, the organic mask treatment reduces the wiggling of the organic mask, causing the memory lines to be straighter.

In an experiment, after the organic mask treatment, the wiggle was reduced to 2.3 nm 3σ. It was found that the amorphous carbon layer was etched by ~10 nm. It was also found that the etch layer was not etched.

Figure 8:
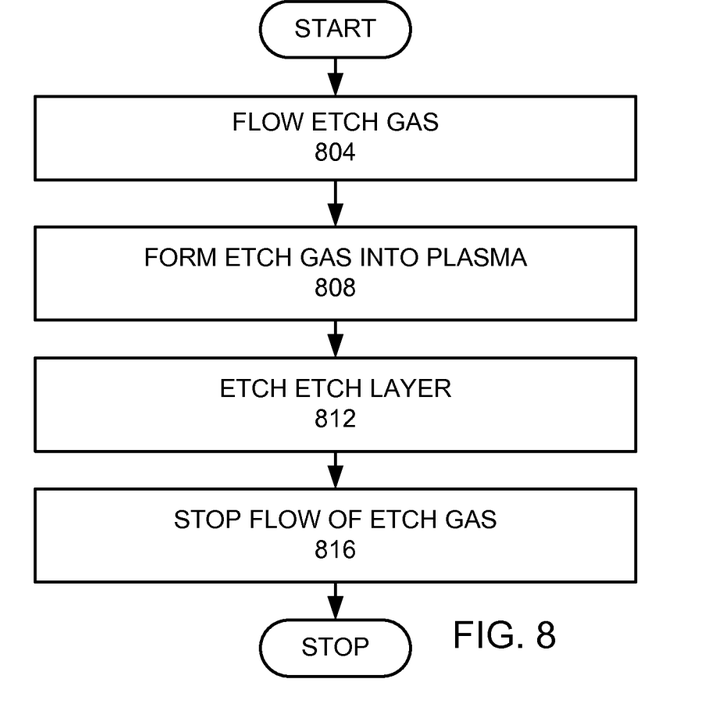
FIG. 8 is a more detailed flow chart of the step of etching the etch layer.

After the organic mask treatment, the etch layer is etched (step 116). FIG. 8 is a more detailed flow chart of the step of etching the etch layer. An etch gas comprising a fluorine containing etchant is flowed from the etch gas source 416 into the plasma processing chamber 400 (step 804). The etch gas is formed into a plasma (step 808). Exposure of the etch layer to the plasma from the etch gas causes the etch layer to be further etched away (step 812). After the etch is completed, the process is stopped, which in this example, is by stopping the flow of the etch gas (step 816).

An example of a recipe provides a pressure of 20 mTorr. An etch gas of 20-40 sccm of a mixture of one or more of $CHF_3$, $C_4F_8$, or $CH_2F_2$, and 10-20 sccm $O_2$, and 100-200 sccm Ar is flowed from the etch gas source 416 into the plasma processing chamber 400 (step 804). An RF signal at 475 watts is provided to the plasma processing chamber 400 to form the etch gas into a plasma (step 808). A temperature is maintained at 30° C. The process is maintained for 45 seconds to etch the etch layer (step 812), before the flow of the etch gas is stopped (step 816).

Figure 2D:
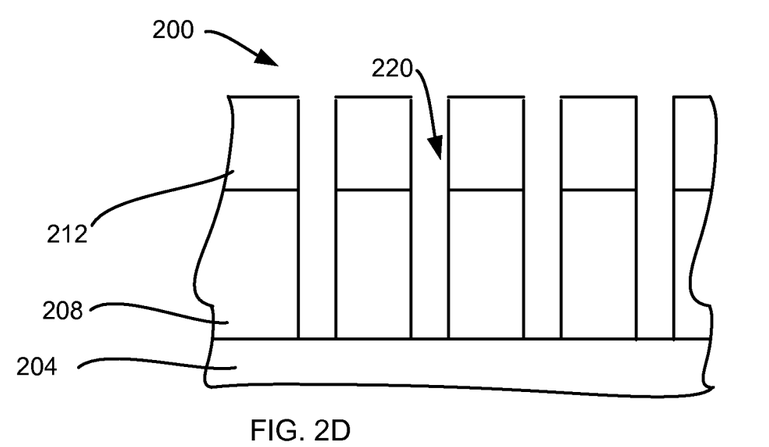
Figure 3D:
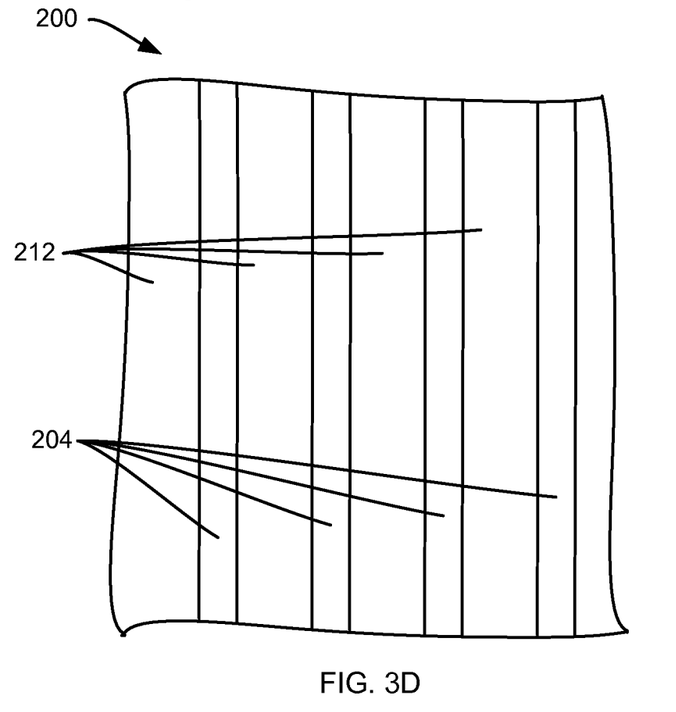

FIG. 2D is a cross-sectional view of the stack 200 after the etch. FIG. 3D is a top view of the stack after the etch. In the example, the etch layer 208 is completely etched. As schematically illustrated, the organic mask treatment reduces wiggling from the subsequent etch, causing the memory lines to be straighter. In an experiment, it was found after a full etch wiggling is maintained at 2.6 nm 3σ.

The substrate may then be removed from the chamber (step 120). Additional processes may occur after the etch is completed and before the substrate is removed from the chamber.

Without being bound by theory, it is believed that wiggling of the organic mask layer is caused by fluorine inserting into the backbone of the organic mask layer material. This insertion can lead to swelling and/or induced stress, which leads to deformation and thus wiggling of the organic mask layer. The deformation and wiggling, if left unchecked, would cause the trenches and resulting memory lines to be deformed and to wiggle, thus making them non-linear, which would have detrimental effects on the resulting device, such as a memory device.

It has been unexpectedly found that an organic mask treatment using a plasma generated from $H_2$ and $N_2$ corrects previous wiggling from a previous etch and hardens the organic mask so that there is reduced wiggling in a subsequent etch. It is believed that forming a plasma from $H_2$ and $N_2$ creates reactive H● and N● radicals and $H^+$ and $N^+$ ions, which when exposed to a fluorinated organic mask, recombine with the fluorine that is inserted in the organic mask, removing the fluorine from the material matrix of the organic mask, which corrects the previous wiggling. In addition, it is believed that the H and N interact with the organic mask and penetrate into the organic mask, so that subsequent fluorination from fluorine exposure to the etch chemistry is more difficult allowing for long etch times without the onset of wiggling.

Preferably, the organic mask is at least 200 nm thick. Such a thickness is more susceptible to wiggling for typical CD line and space features. In experiments, the onset of wiggling has been observed when only ~30 nm of oxide has been etched, where the full oxide layer for this application is ~80 nm. It is believed that the onset of wiggling would be observed even if the full thickness were much higher. Embodiments would provide an etch for stacks with dielectric layers with a thickness of ~50-200 nm. Preferably, this embodiment is used in a double mask process to increase line density. Such a process provides trenches with a CD of about 16 nm and lines with a CD of about 32 nm. It is believed that the wiggling risk is higher with these smaller CDs and ~200 nm of mask, as the resulting lines have a high aspect ratio. In other embodiments, the organic mask is a polymer, such as photoresist. Preferably, the organic mask is amorphous carbon, the cap layer is silicon based, which is more preferably SiON, and the etch layer is silicon oxide based.

Preferably, the treatment gas consists essentially of $H_2$ and $N_2$. Preferably, the RF power to form the treatment gas into a plasma is no more than 600 watts. More preferably, the RF power to form the treatment gas into a plasma is between 300 and 500 watts. Preferably, the bias is less than 100 volts. More preferably, the bias is between 10 and 60 volts. Preferably, the bias during the etch steps is greater than 100 volts. Although in the above examples, each process is stopped by stopping the flow of a process gas, other methods may be used to stop a process, such as by changing RF power.

Other embodiment may use other halogens for etching. However, preferably, fluorine is used for etching. Preferably the organic mask treatment does not etch the etch layer.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching trenches in an etch layer disposed below a patterned organic mask, comprising:
   treating the patterned organic mask, comprising:
      flowing a treatment gas comprising $H_2$ and $N_2$;
      forming a plasma from the treatment gas;
      making patterned organic mask more resistant to wiggling; and
      stopping the flow of the treatment gas; and etching trenches in the etch layer through the patterned organic mask.

2. The method, as recited in claim 1, further comprising partially etching trenches in the etch layer through the patterned organic mask before treating the patterned organic mask, wherein the treating the patterned organic mask further comprises repairing wiggling caused by partially etching trenches in the etch layer through the patterned organic mask.

3. The method, as recited in claim 2, wherein the treatment gas is halogen free.

4. The method, as recited in claim 2, wherein the treating the patterned organic mask does not etch the etch layer.

5. The method, as recited in claim 2, wherein the treatment gas consists essentially of $H_2$, $N_2$, and an inert gas.

6. The method, as recited in claim 2, wherein the treatment gas consist essentially of $H_2$ and $N_2$.

7. The method, as recited in claim 2, wherein the forming a plasma uses no more than 600 watts of RF power.

8. The method, as recited in claim 7, wherein the treating the patterned organic mask, further comprises providing a bias less than 100 volts.

9. The method, as recited in claim 8, wherein etching the features, further comprises providing a bias of greater than 100 volts.

10. The method, as recited in claim 2, further comprising:
placing a wafer with the etch layer and patterned organic mask in a process chamber before the partially etching the trenches; and
removing the wafer from the process chamber after etching the etch layer.

11. The method, as recited in claim 2, wherein the partially etching the features in the etch layer, comprises:
flowing a fluorine containing etch gas;
forming a plasma from the etch gas, wherein the plasma from the etch gas causes the patterned organic mask to wiggle; and
stopping the flow of the etch gas.

12. The method, as recited in claim 11, wherein the etching the features in the etch layer, comprises:
flowing a fluorine containing etch gas;
forming a plasma from the etch gas; and
stopping the flow of the etch gas.

13. The method, as recited in claim 2, wherein the patterned organic mask is an amorphous carbon mask.

14. The method, as recited in claim 13, wherein the patterned organic mask is at least 100 nm thick.

15. The method, as recited in claim 2, wherein the partial etching features in the etch layer etches away a silicon containing layer over the patterned organic mask.

16. The method, as recited in claim 2, wherein the etching the trenches etches trenches with a critical dimension of no more than 16 nm forming memory lines with a critical dimension of no more than 32 nm.

17. The method, as recited in claim 1, wherein the treatment gas consist essentially of $H_2$ and $N_2$.

18. A method for etching trenches in an etch layer disposed below a patterned organic mask, comprising:
partially etching trenches in the etch layer through the organic mask, comprising:
flowing a fluorine containing etch gas;
forming a plasma from the etch gas, wherein the plasma from the etch gas causes wiggling of the patterned organic mask; and
stopping the flow of the etch gas;
treating the patterned organic mask, comprising:
flowing a treatment gas comprising $H_2$ and $N_2$, wherein the treatment gas is halogen free;
forming a plasma from the treatment gas;
repairing wiggling of the patterned organic mask;
making patterned organic mask more resistant to wiggling; and
stopping the flow of the treatment gas; and
etching trenches in the etch layer through the patterned organic mask, comprising:
flowing a fluorine containing etch gas;
forming a plasma from the etch gas; and
stopping the flow of the etch gas.

* * * * *